United States Patent [19]

Luhowy

[11] 4,138,654
[45] Feb. 6, 1979

[54] DIGITALLY TUNED CIRCUIT INCLUDING SWITCHING OF BANK CAPACITORS BETWEEN PLURAL TUNED CIRCUITS

[75] Inventor: Gabriel J. Luhowy, Lima, N.Y.

[73] Assignee: Harris Corporation, Cleveland, Ohio

[21] Appl. No.: 832,680

[22] Filed: Sep. 12, 1977

[51] Int. Cl.² ............................ H03J 5/14; H03J 5/18
[52] U.S. Cl. ...................................... 334/55; 325/171; 325/468; 333/70 R; 333/77; 334/11; 334/19; 328/137; 328/167
[58] Field of Search .............................. 325/171-177, 325/482, 458, 459, 468; 333/17 R, 70 R, 70 A; 334/14, 16, 26, 55, 17, 18, 19, 11; 328/137, 167

[56] References Cited

U.S. PATENT DOCUMENTS

| | | | |
|---|---|---|---|
| 3,054,057 | 9/1962 | Bettin et al. | 334/55 X |
| 3,509,500 | 4/1970 | McNair et al. | 333/17 R X |

Primary Examiner—Paul L. Gensler

[57] ABSTRACT

An electrically tuned filter arrangement including several tuned filters which may alternatively be coupled to the input and output of the filter arrangement so as to provide the arrangement with different tuning ranges. Each tuned filter has a tuning input to which a capacitive impedance is to be connected for establishing the center tuning frequency of the filter. A capacitor bank is provided including plural individual capacitor elements, and means for coupling any selected combination of the capacitor elements to a capacitive impedance output. This capacitive impedance output is switchably connectable to the tuning inputs of any of the tuned filters. A filter control circuit is provided which responds to a frequency selection signal to automatically connect the appropriate tuned filter to the input and output of the filter arrangement, to couple the capacitive impedance output of the capacitor bank to the tuning input of the tuned filter thus selected, and to cause an appropriate combination of capacitor elements to be coupled to the capacitive impedance output. The filter arrangement is thus automatically tuned to the frequency indicated by the frequency selection signal.

8 Claims, 7 Drawing Figures

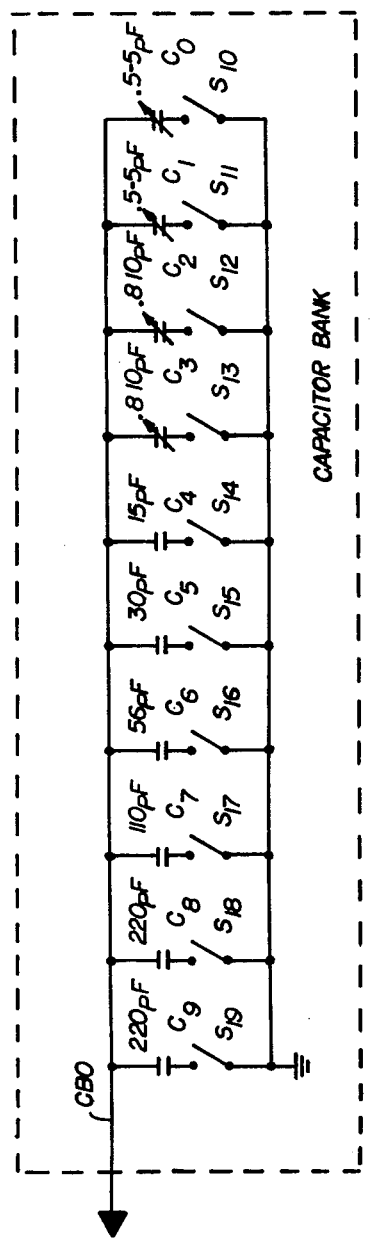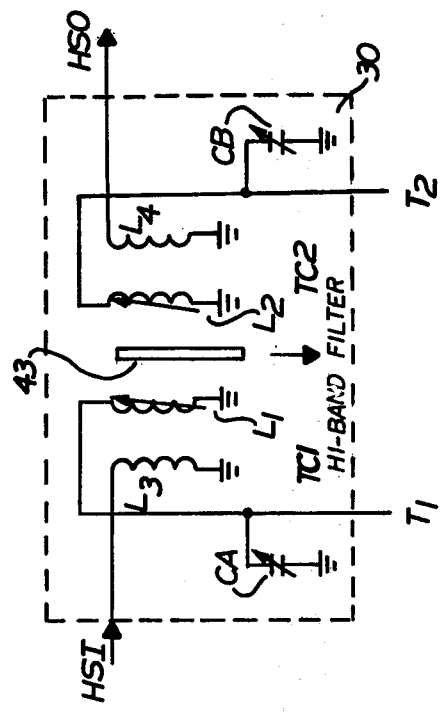

FILTER CONTROL 42

DIGITALLY TUNED CIRCUIT INCLUDING SWITCHING OF BANK CAPACITORS BETWEEN PLURAL TUNED CIRCUITS

BACKGROUND AND FIELD OF THE INVENTION

The present invention relates to the art of electrical filter arrangements, and more particularly to a digitally tuned filter circuit including a plurality of capacitors which may be selectably coupled to one of several tuned filters so as to incrementally vary the tuning frequency of the filter.

Radio receivers commonly include circuits, known as preselector circuits, which are interconnected at a point in the signal path prior to the receiver. These preselector circuits are tunable and are included for the purpose of providing an initial stage of frequency selection so as to eliminate out-of-band frequency components. Similar circuits, known as post-selector circuits, are commonly included in transmitters between the exciter stage and the power amplifier for similar reasons. Currently, the control of these pre- and post-selector circuits is accomplished by mechanical servo drive systems. These systems not only tend to be quite expensive but also operate very slowly, particularly for widely-spaced frequencies.

Efforts have therefore been directed to providing a non-mechanically tuned circuit meeting speed and flexibility requirements. The prior art in this area is exemplified by the following U.S. patents: Jensen et al., U.S. Pat. No. 3,166,726; Nilssen et al., U.S. Pat. No. 3,518,586; Keese, U.S. Pat. No. 3,651,469; Imazeki, U.S. Pat. No. 3,794,925; Imazehi et al., U.S. Pat. No. 3,895,303; Van Anrooy, U.S. Pat. No. 3,913,020; and Pflasterer, U.S. Pat. No. 3,961,261.

SUMMARY OF THE INVENTION

The present invention provides a comparatively simple and inexpensive electrically tuned filter arrangement which allows rapid and precise tuning over a wide frequency range.

In accordance with the present invention, an electrically tunable filter system is provided which includes at least two filter portions. These filter portions have signal inputs and signal outputs and are adapted to respond to an input signal which is supplied at the signal input for filtering that signal so that only those components of the signal which are within a selected frequency range appear at the signal output. Each of these filter portions further has a tuning input to which a capacitive impedance is to be connected for establishing the selected frequency range of the filter portion. The filter portions are designed so that different frequency ranges will be provided by the filter portions when the same capacitive impedance is coupled to the tuning inputs thereof. A capacitive impedance circuit is provided which includes plural individual capacitor elements and means for coupling a selected combination of the capacitor elements to a capacitive impedance output in response to a first control signal. The filter system, as a whole, also has an input and an output. A controllable coupling means is provided which is responsive a second control signal for selectably coupling the signal input and signal output of a selected filter portion to the input and output of the filter system and for also coupling the capacitive impedance circuit to the tuning input of the selected filter portion. A frequency selection circuit provides a frequency selection signal which is indicative of the desired frequency range of the filter. Filter control means are provided which are responsive to the frequency selection signal so as to provide first and second control signals in accordance therewith. These first and second control signals cause a selected combination of capacitor elements to be coupled to the capacitive impedance output, and to further couple a selected filter portion to the system input/output and the capacitive impedance to the selected filter portion. In this manner, the desired frequency range is automatically set into the filter system.

BRIEF DESCRIPTION OF THE DRAWINGS

The foregoing and other objects and advantages of the present invention will become more readily apparent from the following description of a preferred embodiment, as taken in conjunction with the accompanying drawings which are a part hereof and wherein:

FIG. 2 is a schematic illustration of a doubly-tuned, magnetically coupled filter for use in the preselector circuit of FIG. 1;

FIG. 3 is a schematic diagram of the capacitor bank used in the preselector circuit of FIG. 1;

DETAILED DESCRIPTION OF THE DRAWINGS

Figure 1:
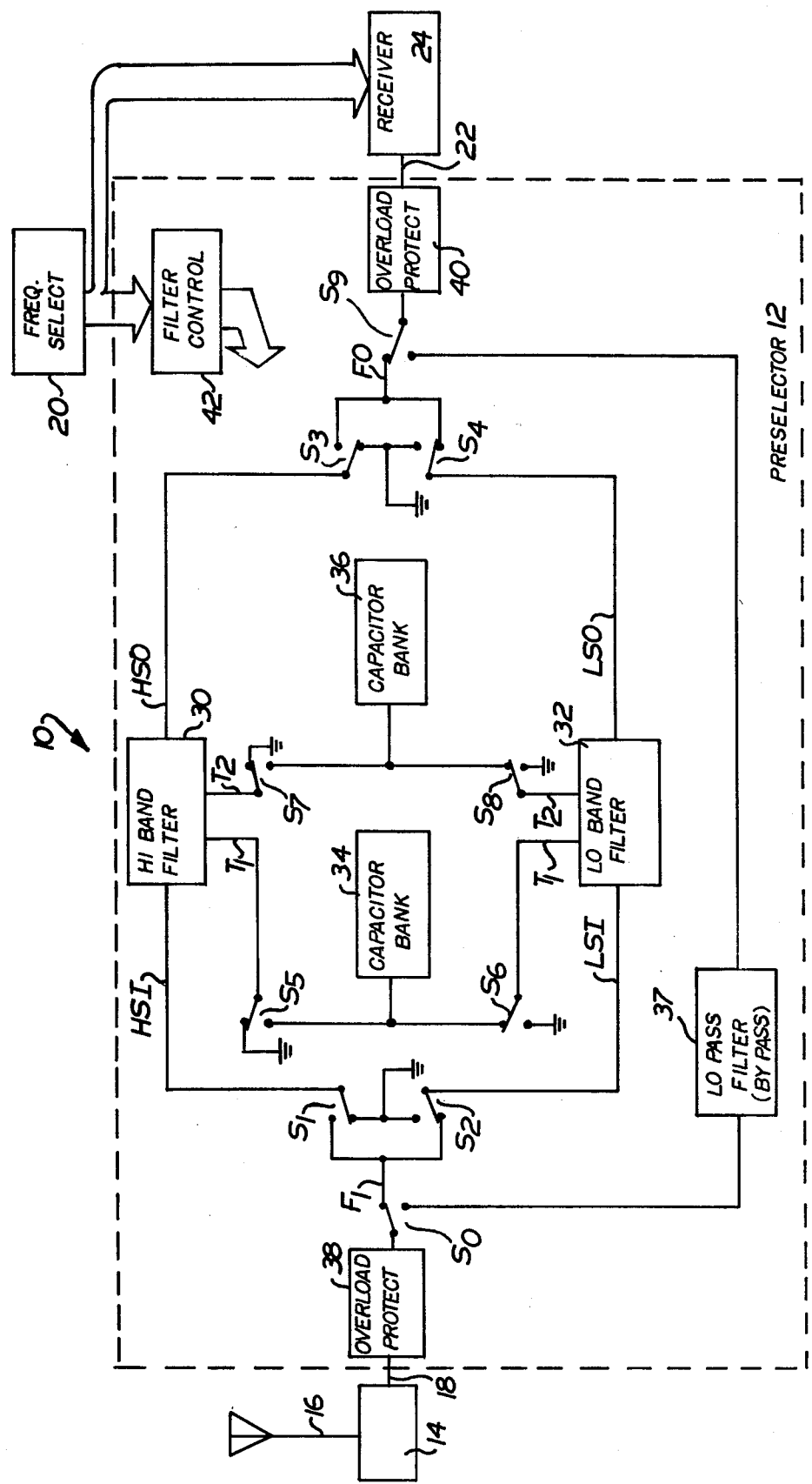
FIG. 1 is a block diagram of a receiver circuit employing an electrically tunable preselector in accordance with the teachings of the present invention.

There is shown in FIG. 1 a receiver system 10 in which an electrically tunable filter in accordance with the teachings of the present invention could conveniently find use. In this system, the electrically tunable filter functions as a preselector for initially processing the input signal so as to remove out-of-band components therefrom.

Preselector 12 comprises essentially a bandpass filter having a center tuning frequency which is automatically adjusted in accordance with a frequency selection signal provided by frequency selection circuit 20. Frequency selection circuit 20 could, for example, comprise thumb wheel switches which are manually settable by an operator to select a desired center frequency. These frequency selection signals are directed to preselector 12, and serve to electrically tune the preselector in a manner which will be more clearly described hereinafter.

Preselector 12 receives an input signal along an input line 18 from an antenna 16 by means of an input filter 14, and provides processed output signals to a receiver 24 via an output line 22. Receiver 24 also responds to the frequency selection signals generated by frequency selector 20 and, in accordance therewith, establishes the frequency of operation of a local oscillator. This oscillator is then used for purposes of detecting the incoming signal in accordance with well-known heterodyne techniques.

In the illustrated embodiment, preselector 12 includes two doubly-tuned, magnetically coupled filters 30 and 32. Each of these filters has a signal input HSI and LSI and a signal output HSO and LSO as well as two tuning inputs T1 and T2. Each filter may be tuned by connecting similar capacitive impedances to both tuning inputs T1 and T2 by means of capacitor banks 34 and 36. The center tuning frequency provided by the filter will be determined by the magnitude of the capacitive impedance which is coupled to these tuning inputs.

Filters 30 and 32 will preferably be designed to have different frequency ranges when similar capacitive impedances are coupled to the corresponding tuning inputs thereof. For the range of capacitive impedances provided by capacitor banks 34 and 36 (to be described hereafter), for example, high band filter 30 may provide a center tuning frequency range of between 8 and 30 MHz while low band filter 32 may provide a center tuning frequency range of between 2 and 8 MHz. It is therefore possible to tune the center tuning frequency of preselector 12 to anywhere within the range of 2 to 30 MHz by selecting which one of filters 30 or 32 is to be connected into the circuit and an appropriate capacitive impedance from capacitor banks 34 and 36. When a frequency of less than 2 MHz is selected, a low-pass filter 37 will instead be connected into the circuit.

The selection of which of filters 30, 32, or 37 is to be connected into the circuit is determined by the position of switches $S_0 - S_9$. Switches $S_0$ and $S_9$ will be controlled jointly so as to either connect filter 37 into the circuit, or not. Similarly, switches $S_1$, $S_3$, $S_5$, and $S_7$ will be jointly controlled to either connect filter 30 into the circuit, or not, while switches $S_2$, $S_4$, $S_6$, and $S_8$ will be jointly controlled to either connect filter 32 into the circuit, or not. In FIG. 1, switches $S_2$ and $S_4$ connect the signal input LSI and output LSO, respectively, to the filter input FI and output FO, while capacitor banks 34 and 36 are connected to tuning inputs T1 and T2 of filter 32 by switches $S_6$ and $S_8$. At the same time, switches $S_1$, $S_3$, $S_5$, and $S_7$ connnect the various inputs and outputs of filter 30 to ground so as to prevent noise problems. When filter 37 is selected, of course, filter 32 will also be grounded in this manner by switches $S_2$, $S_4$, $S_6$, and $S_8$.

From the foregoing it will be seen that capacitor banks 34 and 36 serve to provide capacitive impedances for either filter 30 and 32, depending on which is in use at the time. If these capacitor banks were not shared in this manner, it would be necessary to include twice as many capacitor banks. This would lead to a commensurate increase in the cost and complexity of the circuit.

In a preferred embodiment, overload protection circuits 38 and 40 are respectively coupled to the input and output of the preselector circuit. Overload protection circuit 38 is provided to prevent overloads having a magnitude which would damage the preselector itself, while overload protection circuit 40 is provided for preventing the occurrence of overloads which, although not damaging to preselector 12, could cause damage to receiver 24.

A filter control circuit 42 responds to the frequency selection signal provided by frequency selection circuit 20 to control the position of switches $S_0 - S_9$, as well as to control the operation of capacitor banks 34 and 36 so as to control the magnitude of the capacitive impedance which is coupled to the tuning inputs of filters 30 and 32. defined Referring now to FIG. 2 there is shown a more detailed diagram of high-band filter 30 of FIG. 1. In this drawing it will be seen that high-band filter 30 comprises a doubly-tuned, magnetically coupled filter with link coupling on the input and output thereof. The advantage of use of a filter of this sort is that the percentage bandwidth remains essentially constant over a very wide tuning range. The filter basically includes two magnetically coupled, tuned circuits TC1 and TC2, each comprised of a corresponding slug tuned inductor (L1 and L2) and a capacitance defind by the parallel combination of a corresponding capacitor (CA and CB) and whatever capacitors are coupled to the tuning input (T1 and T2) thereof. The input signal is coupled into the first tuned circuit TC1 by means of link L3, and is coupled out of the second tuned circuit TC2 by means of link L4. The amount of coupling between tuned circuits TC1 and TC2 will be adjusted by adjusting the position of a sliding metal partition 43. The partition will be positioned so as to optimize the insertion loss versus selectivity characteristic of the filter.

Low-band filter 32 will be constructed in a manner quite similar to high-band filter 30, except that the inductances included in the tuned circuits will be selected to provide operation within a different frequency range.

Referring now to FIG. 3, a more detailed illustration of capacitor bank 34 is provided. In this drawing it will be seen that capacitors C0 through C9 are each coupled on one side to a common capacitor bank output CBO and on the other side to one terminal of a corresponding switch element $S_{10}$–$S_{19}$. The other terminals of switches $S_{10}$–$S_{19}$ are commonly coupled to signal ground. It will thus be seen that any combination of capacitors C0–C9 may be coupled between the capacitor bank output line CBO and signal ground by closure of the corresponding switch. As stated previously, capacitor bank output CBO will be coupled to the T1 tuning input of either high-band filter 30 or low-band filter 32 via switches $S_5$ and $S_6$. Capacitor bank 36 will have a form identical to that of capacitor bank 34. Furthermore, corresponding switches of capacitor banks 34 and 36 will be operated in unison with one another, whereby at any given time, each capacitor bank will have a substantially similar capacitor impedance coupled between the corresponding capacitor bank outputs CBO and signal ground. Consequently, by selective actuation of an appropriate combination of switches $S_{10}$–$S_{19}$, the center tuning frequency of the filter 30 or 32 to which they are coupled may be varied.

Figure 4:
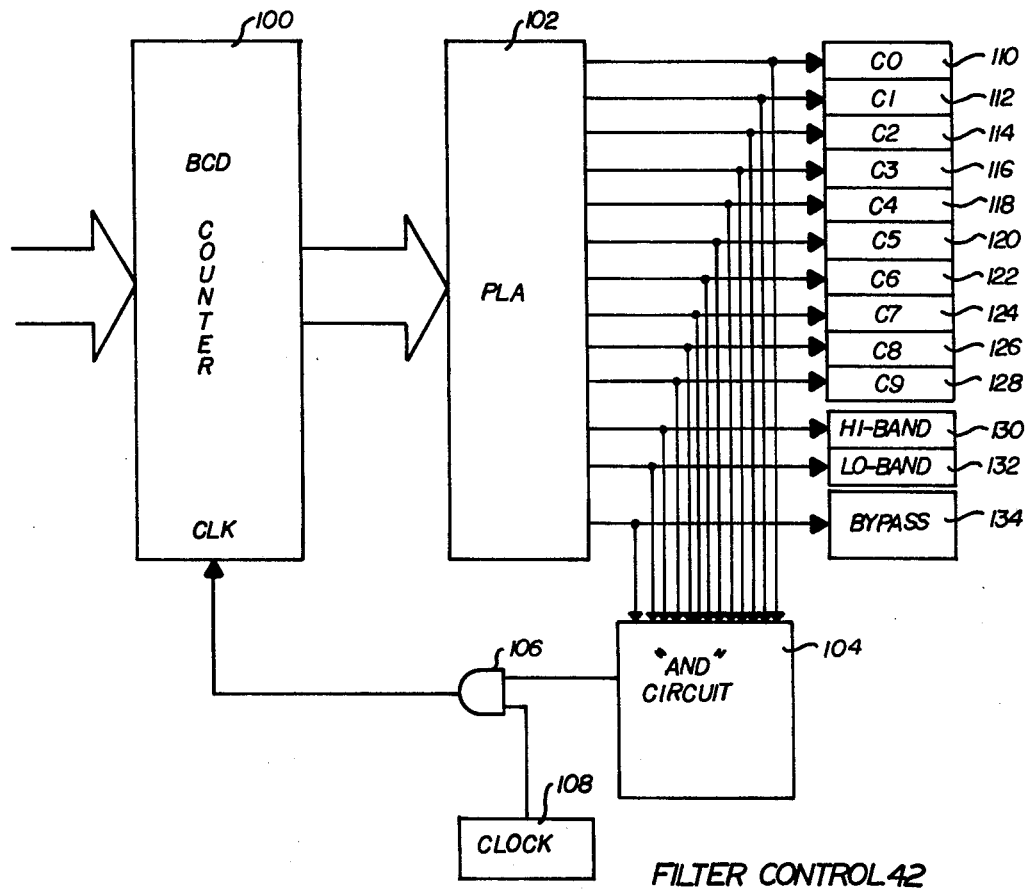
FIG. 4 is a block diagram of a first embodiment of a filter control circuit which may be used in the preselector of FIG. 1.

There is illustrated in FIG. 4 a diagram of one embodiment of filter control 42. In this embodiment, the binary-coded-decimal (BCD) frequency selection signal provided by frequency selection circuit 20 is loaded into a BCD counter 100. The BCD count thus loaded within counter 100 is supplied to a programmable logic array (PLA) 102. PLA 102 has been programmed so that an output is provided therefrom only when the BCD count supplied by counter 100 corresponds exactly to the center tuning frequency which is achievable by selection of a given set of capacitors to tuning inputs T1 and T2 to either filter 30 or 32. If this BCD count signal does correspond to one of these discrete values, then PLA 102 will provide a coded output which will actuate the appropriate combination of switches.

In the event that the BCD count contained within counter 100 is not equal to one of these discrete values, however, then the output of PLA 102 will comprise all binary "1'5". The existence of this condition is detected by "ANDing" all of the output signals supplied by PLA 102 through use of an AND circuit 104. When an "all-1's" condition exists, the output of AND circuit 104 will be at a logic "1" level, thereby enabling a second AND circuit 106 to pass clock signals provided by clock circuit 108. The clock pulses which will then appear at the output of AND gate 106 will be directed to the clock input to BCD counter 100, and will cause counter 100 to count down from the value loaded therein from frequency select circuit 16. At some point, the count contained within BCD counter 100 will exactly equal the center frequency obtainable by the selection of some appropriate combination of capacitors and filters. PLA 102 will then provide a correspondingly coded output signal, thus removing the all-1's condition which had previously existed. The output of AND circuit 104 will therefore drop to a logic zero level, thus disabling AND gate 106 from producing a further decrementing of the count contained within BCD counter 100. In the manner, a count loaded into BCD counter 100 will be modified to match the next lower center frequency for which a corresponding coded output of PLA 102 exists.

The coded output of PLA 102 will be directed to relay driver circuits 110-134, and will cause the selective energization thereof. These relay driver circuits will be inactive upon the presence of a logic "1" signal at the input, and will produce energization of a corresponding relay or relays only when a logic "0" level is presented at the input by PLA 102.

Figure 5:
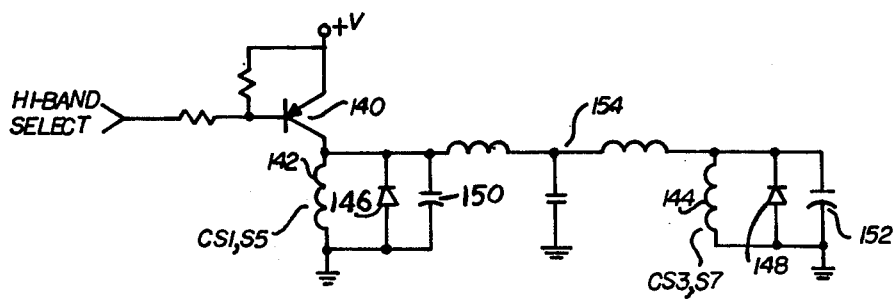
FIG. 5 is a schematic illustration of a relay driver circuit for use in the preselector of FIG. 1.

An exemplary form of one of relay driver circuits 110-134 is illustrated in FIG. 5, which corresponds to the contents of the block identified by reference numeral 130 in FIG. 4. This relay driver circuit includes a driver transistor 140 which is connected so as to supply power to a load circuit during the presence of a logic "0" at the input thereof, and to block the supply of power thereto during the presence of a logic "1" at the input thereof. Inductors 142 and 144, which are the coil elements of DPDT relays, represent the load elements of this circuit. Relay coil 142 operates contacts $S_1$ and $S_5$, while relay coil 144 operates contacts $S_3$ and $S_7$. When no power is being applied to these relay coils, contacts $S_1$, $S_3$, $S_5$, and $S_7$ will be in the position shown in FIG. 1.

Each relay coil 142 and 144 is provided with a transient suppression network comprised of a corresponding clipping diode 146 and 148 and a transient suppression capacitor 150 and 152. A decoupling network 154, comprised of two inductors and a capacitor connected in a low-pass filter arrangement, is additionally provided for preventing signal feed through along the line coupling the two relay coils.

The low-band select circuit 132 will have a form substantially identical to that shown for high-band select circuit 130 of FIG. 5, except that switches $S_2$, $S_4$, $S_6$, and $S_8$ will be operated thereby. Each of the capacitor selection circuits 110-128 will also be substantially similar to the circuitry shown in FIG. 5, except that decoupling network 154 will be deleted as unnecessary. Also, the capacitor selection circuits will conveniently utilize low-cost reed relays rather then the DPDT relay used in the circuitry of FIG. 5. In this event, the two relay coils will each operate a SPST switch associated with corresponding capacitor elements in the two capacitor banks 34 and 36.

Figure 6:
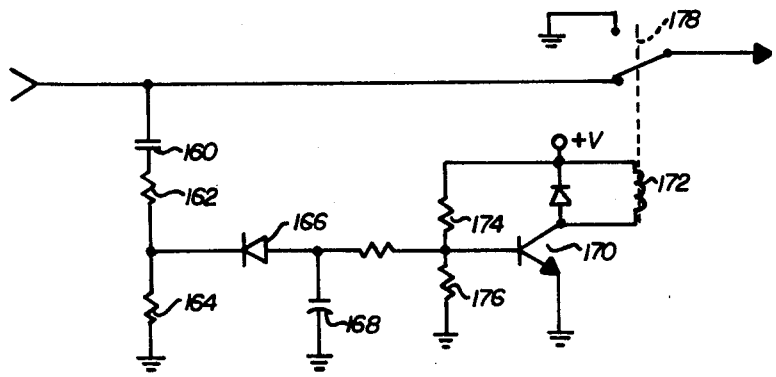
FIG. 6 is a schematic illustration of an overload protection circuit which may find use in the preselector circuit of FIG. 1; and, FIG. 7 is a block diagram of a second embodiment of a filter control circuit which may find use in the preselector of FIG. 1.

There is illustrated in FIG. 6 an overload protection circuit which may be utilized to provide the function of overload protection circuits 38 and 40 of FIG. 1. This circuit includes a high impedance input circuit comprised of capacitor 160 and resistors 162 and 164 for developing an input signal at one electrode of diode 166. Diode 166, in conjunction with capacitor 168, serves the function of providing a half-wave rectifier for developing a negative peak voltage across capacitor 168. This negative voltage serves to draw current away from the base of a transistor 170 which is utilized for energizing a relay coil 172. Transistor 170 is biased in an ON condition by a bias network comprised of resistors 174 and 176. When the amount of current drawn away from the biasing network by the negative voltage developed across capacitor 168 exceeds a critical level, transistor 170 will switch to an OFF condition, de-energizing relay coil 172. This will cause the relay contacts 178 protected open, thereby disconnecting the of a circuit from the signal line. This condition will continue as long as the overload condition persists. When the overload condition subsides, the magnitude of the negative voltage developed across the capacitor 168 will diminish accordingly, thus allowing the biasing network to once again switch transistor 170 into a conductive condition. This will produce the energization of relay coil 172 and the subsequent connection of the protected circuit to the signal line through relay contacts 178.

Figure 7:
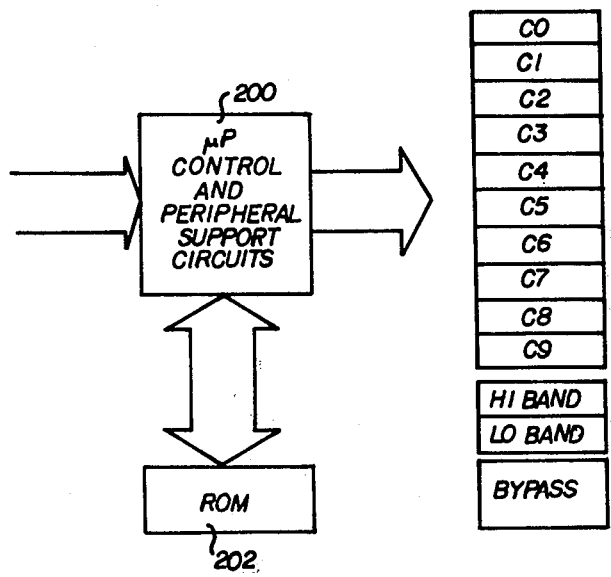

There is illustrated in FIG. 7 a second embodiment of filter control 42 of FIG. 1. In this embodiment, the frequency selection signals provided by frequency select circuit 20 are provided to a microcomputer arrangement comprised of a microprocessor control chip and various peripheral support chips. Microcomputer 200 will interact with a read-only memory circuit 202 to select the combination of capacitors which provides a center tuning frequency most closely matching the frequency selected by frequency select circuit 20. Microcomputer 200 will be programmed via macro-instructions included in the read-only memory 202 in order to perform this function. These instructions will lead microprocessor control circuit 200 through a logic tree wherein the end result of the computation will be the required coded output.

Although the invention has been described with respect to a preferred embodiment, it will be appreciated that various rearrangements and alterations of parts may be made without departing from the spirit and scope of the present invention, as defined in the appended claims.

What is claimed is:

1. An electrically tunable filter system comprising at least two filter portions having signal inputs and signal outputs and adapted to respond to an input signal supplied at said signal input for filtering said signal so that only those components of said input signal which are within a selected frequency range appear at said signal output, each of said filter portions further having a tuning input to which a capacitive impedance is to be connected for setting said selected frequency range; capacitive impedance means comprising plural individual capacitor elements and first controllable coupling means responsive to a first control signal for controllably coupling a selected combination of said capacitor elements to a capacitive impedance output; filter system input and output means; second controllable coupling means responsive to a second control signal for selectively coupling said signal input and signal output of a selected filter portion to said filter system input means and filter system output and for also coupling said capacitive impedance output of said capacitive impedance means to said tuning input of said selected filter portion; means for providing a frequency selection signal indicative of a selected frequency range; and, filter control means responsive to said frequency selection signal for providing said first and second control signals in accordance therewith so as to couple a selected combination of said capacitor elements to said capacitive impedance output, and so as to further couple a selected filter portion to said system input and output, and said capacitive impedance means to said tuning input of said selected filter portion whereby said selected frequency range of said filter system is automatically set into said filter system in accordance with said frequency selection signal.

2. An electrically tunable filter system as set forth in claim 1, wherein each of said filter portions includes at least two tuned circuits, each having a said tuning input, wherein said capacitive impedance means comprises at least two capacitor banks each including plural individual capacitor elements and a corresponding said capacitive impedance output, and wherein said second controllable coupling means serves to couple said capacitive impedance outputs of each of said at least two capacitor banks to a corresponding said tuning input of said selected filter portion.

3. An electrically tunable filter system as set forth in claim 1, wherein said filter control means includes storage means having stored at addressable positions therein coded signals indicative of all permissible values of said first and second control signals, addressing means responsive to said frequency selection signal for addressing said storage means so as to recover therefrom selected ones of said coded signals, and means responsive to said recovered coded signals for providing first and second control signals in accordance therewith.

4. An electrically tunable filter system as set forth in claim 3, wherein said storage means comprises a programmable logic array having said coded signals programmed at addressable locations therein, said coded signals corresponding directly to said first and second control signals such that said programmable logic array has directly stored therein coded signals corresponding to all permissible values of said control signals.

5. An electrically tunable filter system as set forth in claim 4, wherein each of said coded signals is stored at an address having a value directly related to the value of the center tuning frequency of said electrically tunable filter system which would result if said coded signal were addressed, and wherein said addressing means comprises means responsive to said frequency selection signal for providing a corresponding said address.

6. An electrically tunable filter system as set forth in claim 1, wherein said filter control means comprises programmable computer means programmed to respond to said frequency selection signal for deriving therefrom the first and second control signals which will provide said tunable filter system with a center tuning frequency most nearly corresponding to said selected frequency.

7. An electrically tunable filter system as set forth in claim 1, and further comprising input overload protection means associated with said filter system input for blocking the supply of those signals to said filter system which could potentially damage said filter system, and output overload protection means associated with said filter output for blocking the supply of those signals appearing at said filter output which could potentially damage an output circuit to which said signals would otherwise be directed.

8. An electrically tunable filter system as set forth in claim 1, and further comprising fixed filter means and third controllable coupling means responsive to a third control signal for selectively coupling said fixed filter between said filter system input and filter system output, and wherein said filter control means is further responsive to said frequency selection signals to provide said third conrol signals so as to cause said fixed filter means to be coupled between said filter system input and output when said selected frequency range falls outside of the frequency ranges obtainable through use of said filter portions and within the range of said fixed filter means.

* * * * *